United States Patent [19]

Matsumoto

[11] Patent Number: 5,079,448
[45] Date of Patent: Jan. 7, 1992

[54] EMITTER-FOLLOWER CIRCUIT IN WHICH LOAD CAPACITANCE IS QUICKLY DISCHARGED

[75] Inventor: Kouji Matsumoto, Tokyo, Japan
[73] Assignee: NEC Corporation, Tokyo, Japan
[21] Appl. No.: 596,042
[22] Filed: Oct. 11, 1990
[30] Foreign Application Priority Data Oct. 13, 1989 [JP] Japan .................................. 1-267318

[51] Int. Cl.[5] ..................... H03K 19/096; H03K 17/16
[52] U.S. Cl. ...................................... 307/456; 307/454;
307/263; 307/546; 330/257; 330/288
[58] Field of Search ................ 330/257, 288; 307/443,
307/454, 456, 263, 546

[56] References Cited

U.S. PATENT DOCUMENTS

| 4,467,223 | 8/1984 | Neely ..................... 307/456 |
| 4,485,313 | 11/1984 | Nagano .................. 330/257 |
| 4,857,864 | 8/1989 | Tanaka et al. .......... 330/288 |

Primary Examiner—Stanley D. Miller
Assistant Examiner—Margaret Rose Wambach
Attorney, Agent, or Firm—Helfgott & Karas

[57] ABSTRACT

An emitter-follower circuit suitable for use in an emitter-coupled logic circuit includes an emitter-follower NPN transistor having a first emitter and a second emitter, a biasing circuit having a diode and a first resistor, a load capacitance discharging state detection circuit having a PNP transistor and a second resistor, and a second NPN transistor adapted to be connected with a load. The second resistor detects a current passing through the PNP transistor and the second NPN transistor is activated by the voltage value detected by the second resistor to form a path discharging charge due to a load capacitance. Even when the current amplification $h_{FE}$ of the discharging PNP transistor is low, the second NPN transistor which has a high $h_{FE}$ forms the main discharge current path, so that electric charge on the load capacitance can discharge rapidly. As a result, a high-speed switching emitter-follower circuit is provided.

7 Claims, 4 Drawing Sheets

OUTPUT WAVEFORMS (CONVENTIONAL)

OUTPUT WAVEFORMS (EMBODIMENT)

EMITTER-FOLLOWER CIRCUIT IN WHICH LOAD CAPACITANCE IS QUICKLY DISCHARGED

BACKGROUND OF THE INVENTION

The present invention relates to an emitter-follower circuit and, more particularly, to an emitter-follower circuit suitable for use in an output stage of an emitter-coupled logic circuit (ECL), in which electric charge due to a load capacitance can quickly discharge thereby enabling a high speed switching operation.

An emitter-follower circuit is widely used as an output means in an emitter-coupled logic circuit since such an emitter-follower circuit has a low output impedance and high driving capability to a load capacitance. However, in an emitter-follower circuit having a resistor as a terminator, the output impedance at the fall of an output signal level is quite large as compared with that at the rise of the same, which presents difficulties in achieving a high-speed switching operation at the fall of the output signal level.

SUMMARY OF THE INVENTION

It is, therefore, an object of the invention to overcome the problems existing in the conventional emitter-follower circuit and to provide an improved emitter-follower circuit.

According to one feature of the present invention, there is provided an emitter-follower circuit which comprises:

an emitter-follower NPN transistor of a multi-emitter type;

a biasing circuit having a diode means and a first resistor;

a load capacitance discharging state detection circuit having a discharging PNP transistor and a second resistor for detecting the discharge state of a load charge, said PNP transistor being operable in response to an application of a bias current from said biasing circuit; and a second NPN transistor which forms a main discharge path in response to a detected output of the second resistor of the detecting circuit.

The emitter-follower circuit according to the present invention is distinguished from the prior art in that the discharge current detecting resistor is connected between the collector of the discharging PNP transistor and a power supply at the low potential side so as to detect a current flowing in the discharging PNP transistor and in that the NPN transistor which operates based on the electrical value detected by the discharge current detecting resistor to form the main discharge current path is connected between an output terminal adapted to be connected with a load and the power supply at the low potential side. Thus, according to the present invention, even when a current amplification $h_{FE}$ of the discharging PNP transistor is low, the second NPN transistor which has a high $h_{FE}$ forms a low impedance discharge current path so that electric charge on a load capacitance can discharge rapidly by the low impedance circuit, thereby enabling to achieve high-speed switching of the emitter-follower circuit.

BRIEF DESCRIPTION OF THE DRAWINGS

The above and other objects, features and advantages of the present invention will be apparent from the following description of preferred embodiments according to the invention explained with reference to the accompanying drawings.

FIGS. 2 through 4 show, as results of simulation, characteristics of an ECL circuit having at its output portion an emitter-follower circuit according to the present embodiment of the invention, compared with those in the conventional circuit shown in FIG. 6. FIG. 2 is a graph showing how the delay time tpd during the signal level falling is changed because of $h_{FE}$ of the PNP transistor Q4. FIG. 3 is a graph showing the load capacitance dependence of the delay time tpd.

PREFERRED EMBODIMENTS OF THE INVENTION

Figure 1:
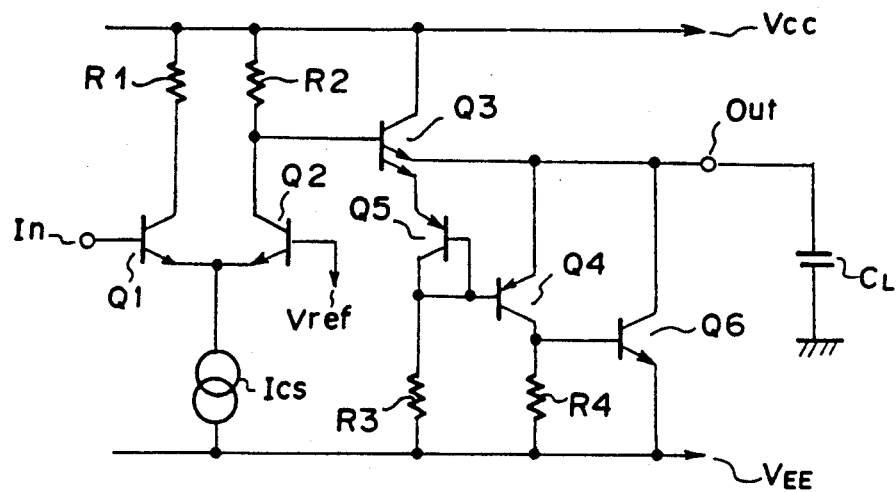
FIG. 1 is a circuit diagram of an emitter-follower circuit according to a first embodiment of the present invention which is utilized as an output means in a current switching type logical circuit.

Throughout the following explanation, similar reference symbols or numerals refer to the same or similar elements in all figures of the drawings.

Firstly, for the purpose of assisting in the understanding of the present invention, a conventional emitter-follower circuit and problems existing therein will be explained by making reference to FIG. 6 before the present invention is explained.

In a conventional emitter-follower circuit having a resistor as a terminator, the output impedance at the fall of an output signal level is large and this has been a problem in achieving a high-speed switching operation. Therefore, in order to improve this, there has been proposed an emitter-follower circuit as shown in FIG. 6 which has been disclosed in, for example, the Japanese Patent Kokai No. Sho 58-43628. FIG. 6 shows an example in which an emitter-follower circuit is used in an output means in a current switching type logical circuit which includes NPN transistors Q1, Q2 having bases coupled to an input In and a reference voltage $V_{ref}$, respectively, resistors R1, R2 and a current source $I_{cs}$. As shown in FIG. 6, the emitter-follower circuit comprises an emitter-follower multi-emitter NPN transistor Q3, a PNP transistor Q4 for discharging the electric charge charged on a load capacitance C1 and a biasing circuit formed of a diode D1 and a resistor R3 to bias the PNP transistor Q4. C1 represents a parasitic capacitance in the biasing circuit for the transistor Q4. The collector of the multi-emitter NPN transistor Q3 is connected to a higher potential power source $V_{CC}$ while its first emitter is connected to the emitter of the PNP transmitter Q4 and the output node and its second emitter is connected to diode D1 of the biasing circuit. The collector of the PNP transistor Q4 is connected to a lower potential power source $V_{EE}$.

Next, the operation of the conventional circuit described above is explained. Let us assume for purposes of simlification of explanation that the forward operation voltages for all of the transistors Q3, Q4 and the diode D1 are equally $V_F$. Since the diode D1 and the PNP transistor Q4 constitute a current mirror circuit, the currents I(D1), I(Q4) which flow respectively in the diode D1 and the transistor Q4 are equal with each other under the state wherein an input signal is stable either at its high level or at its low level.

The current $I_H(D1)$ or $I_H(Q4)$ in the high level state is:

$$I_H(D1) = I_H(Q4) = (2 \cdot V_F - V_{EE})/R3$$

The current $I_L(D1)$ or $I_L(Q4)$ in the low level state is:

$$I_L(D1) = I_L(Q4) = (R2 \cdot I_{CS} + 2 \cdot V_F - V_{EE})/R3$$

When a signal inputted to the base of the transistor Q3 changes from its "Low" level to its "High" level, a charging current is supplied from the transistor Q3 to the load capacitance $C_L$ and the currents which flow in the diode D1 and the transistor Q4 change from their Low state to their High state. The operation in such state is the same as that in an ordinary resistor terminated emitter-follower circuit and, since the output impedance is low, the operation speed is high. On the contrary, when the level of the signal falls, a potential falling takes place without any substantial delay since, in the emitter-follower circuit connected to the diode D1, a time constant ($t = C1 \cdot R3$) of a circuit consisting of the parasitic capacitance C1 and the resistor R3 is small. However, since the load capacitance $C_L$ is markedly larger than the parasitic capacitance C1 and, accordingly, the voltage of the emitter-follower circuit connected to the PNP transistor Q4 is unable to follow the above-mentioned potential falling. For this reason, the voltage between the base and the emitter of the transistor Q4 increases and a large discharge current flows in the transistor Q4. Consequently, the potential at the output terminal Out rapidly falls following the voltage of the biasing circuit. Therefore, in this conventional emitter-follower circuit, the output impedance is low also when the output level falls and its operation is at a high speed.

In the conventional emitter-follower circuit explained above, a high-speed operation is achieved when the current amplification $h_{FE}$ of the discharging transistor Q4 is high. However, when the $h_{FE}$ is low, the base current flows into the resistor R3 and the signal falling speed in the biasing circuit itself of the transistor Q4 decreases. Thus, the output impedance increases at the signal falling operation, which causes a delay in the switching operation, which is a drawback in the emitter-follower circuit.

Reference is now made to FIG. 1, in which an emitter-follower of the first embodiment of the present invention is used as an output means in a current switching type logical circuit. The logical circuit part shown in FIG. 1 is identical to that of FIG. 6.

According to one aspect of the present invention, an emitter-follower circuit is such that a biasing circuit of a discharging PNP transistor Q4 is connected directly to a first emitter of an emitter-follower multi-emitter NPN transistor Q3 and an emitter of the discharging PNP transistor Q4 is connected to a second emitter of the emitter-follower NPN transistor Q3. The emitter-follower circuit includes a resistor R4 for detecting a discharge current, which is provided between the collector of the discharging PNP transistor Q4 and a lower potential side $V_{EE}$ of a power supply and a main discharging NPN transistor Q6, which operates based on a detected voltage value of the discharge current detection resistor. The main discharging NPN transistor Q6 is provided between the second emitter of the emitter-follower NPN transistor Q3 and the lower potential side $V_{EE}$ of the power supply.

The biasing circuit of the emitter-follower circuit of the embodiment of FIG. 1 includes a diode-connected PNP transistor Q5 and a resistor R3, a load capacitance discharging state detection circuit having the above-mentioned PNP transistor Q4 operable on receiving a bias current from the biasing circuit and having the aforementioned resistor R4, and the NPN transistor Q6 serving as a main discharging path.

Now, the operation of the circuit according to this embodiment will be explained. As is the case with the conventional circuit shown in FIG. 6, the diode-connected PNP transistor Q5 and the PNP transistor Q4 constitute a current mirror circuit. When $h_{FE}$ of the transistor Q4 is low, since the base current increases, the current I(R3) passing through the resistor R3 becomes larger than the current I(R4) passing through the resistor R4. Where the input signal is stable either at a High state or at a Low state and the higher potential $V_{CC}$ of the power supply is $V_{CC} = 0$ V, each of such currents may be expressed by the following equations:

The current in the High state:

$$I_H(R3) = (2 \cdot V_F - V_{EE})/R3$$

$$I_H(R4) = \{h_{FE}/(2 + h_{FE})\} \times I_H(R3)$$

The current in the Low state:

$$I_L(R3) = (R2 \cdot I_{CS} + 2V_F - V_{EE})/R3$$

$$I_L(R4) = \{h_{FE}/(2 + h_{FE})\} \times I_L(R3)$$

Then, by setting the value of resistance of the resistor 4 so as to satisfy $$\begin{aligned} R4 \times I_H(R4) &= \{h_{FE}/(2 + h_{FE})\} \\ &\times (2 \cdot V_F - V_{EE}) \\ &\times R4/R3 < V_F, \end{aligned}$$

it is possible to have the transistor Q6 hold its Off state in the Low state, the High state and the output rising transition state.

In the falling operation, since only a parasitic capacitance of a small value is added to the emitter-follower circuit at the transistor Q5, the output potential level falls with substantially no delay. However, since the load capacitance $C_L$ is connected to the output terminal, the emitter-follower circuit at the side of the PNP transistor Q4 is unable to follow a voltage change at the output terminal. Consequently, the base-emitter voltage of the transistor Q4 increases and the transistor Q4 operates in such a way that, by having a larger discharging current flow, it causes a potential fall following the biasing circuit. Here, since the $h_{FE}$ of the PNP transistor Q4 is low, a large base current flows into the resistor R3 to thereby cause a delay in the signal falling speed of the emitter-follower circuit connected to the transistor Q5. However, in the emitter-follower circuit according to this embodiment of the invention, the resistor R4 which is connected between the collector of the PNP transistor Q4 and the low potential power supply source $V_{EE}$, detects a current which flows in the PNP transistor Q4 during the output signal falling. The NPN transistor Q6 is operated based on the result of the detection by the discharge current detecting resistor R4 so that a main discharging path is separately formed in addition to a discharging path by the transistor Q4. Through the operation as explained, the output impedance in the signal falling in the emitter-follower circuit can be made low and the switching operation can be effected at high speed.

Figure 2:
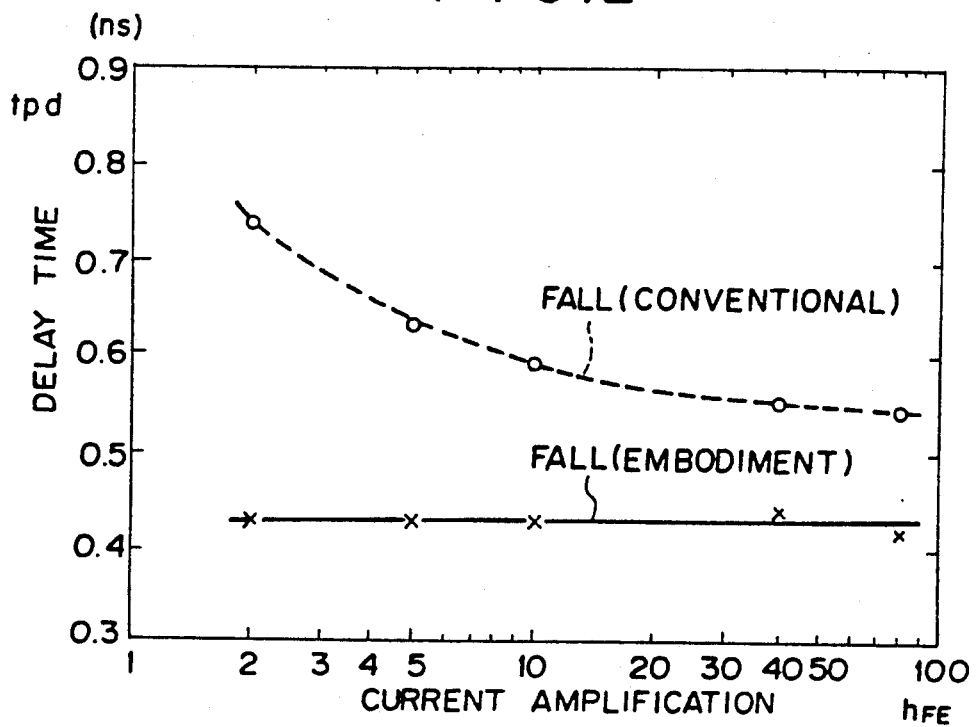
Figure 3:
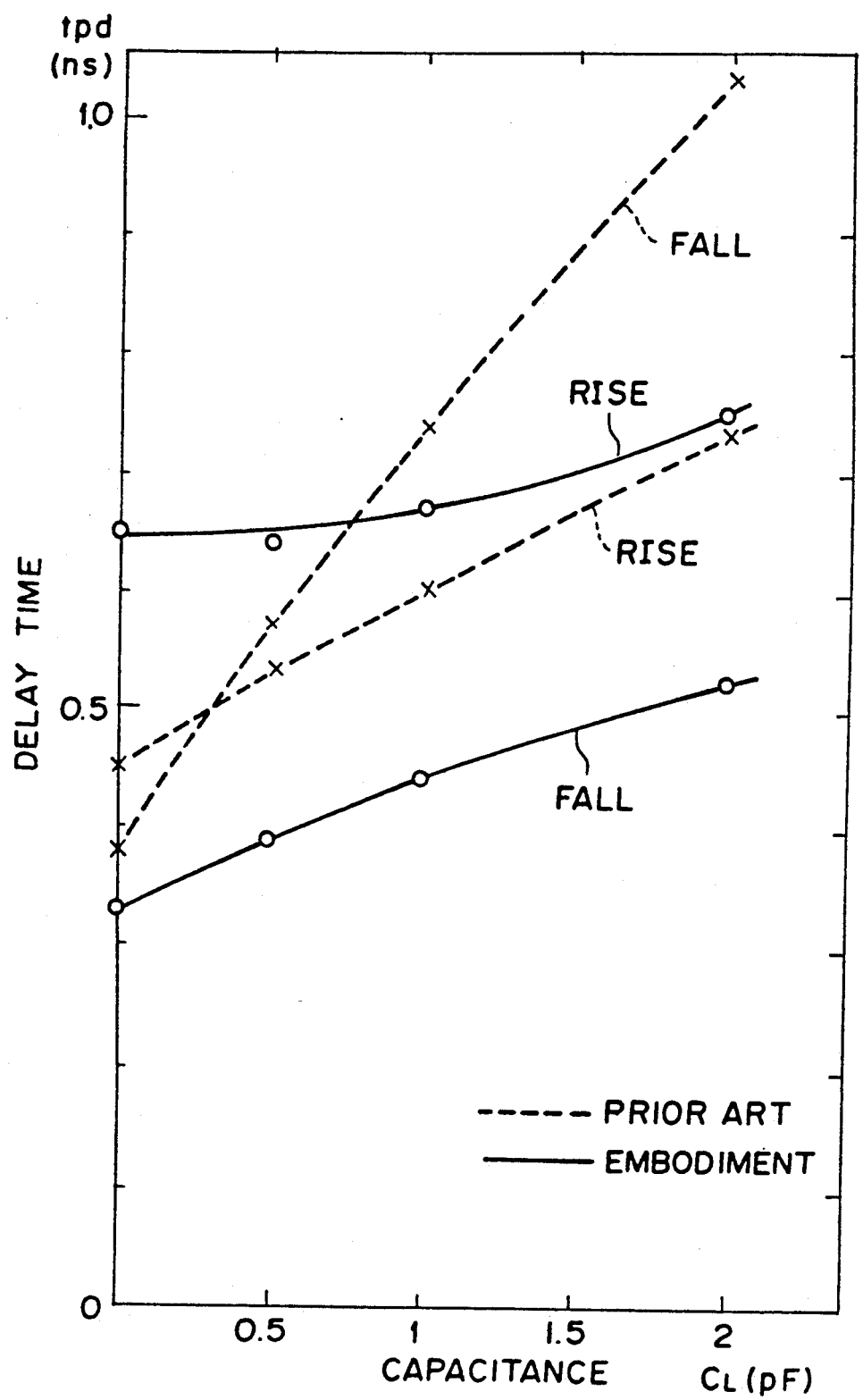
Figure 4A:
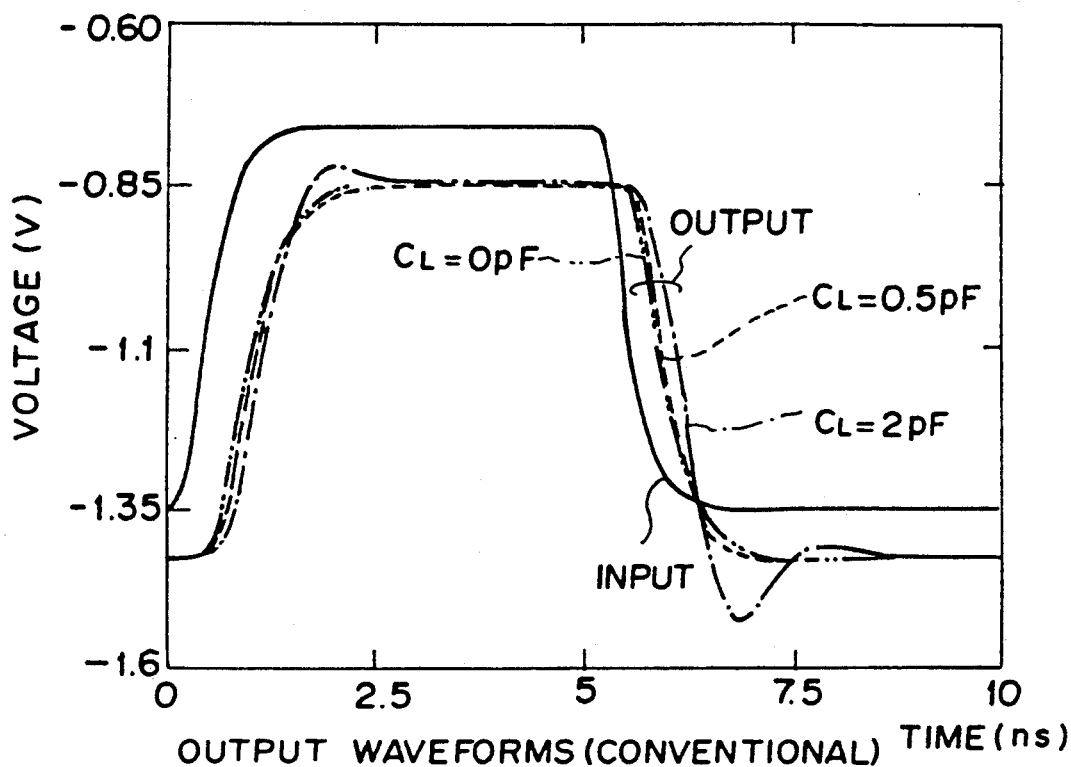
FIGS. 4(a) and 4(b) show respectively the load capacitance dependence of the output waveforms relating to the circuit according to this embodiment and that relating to the conventional circuit.
Figure 4B:
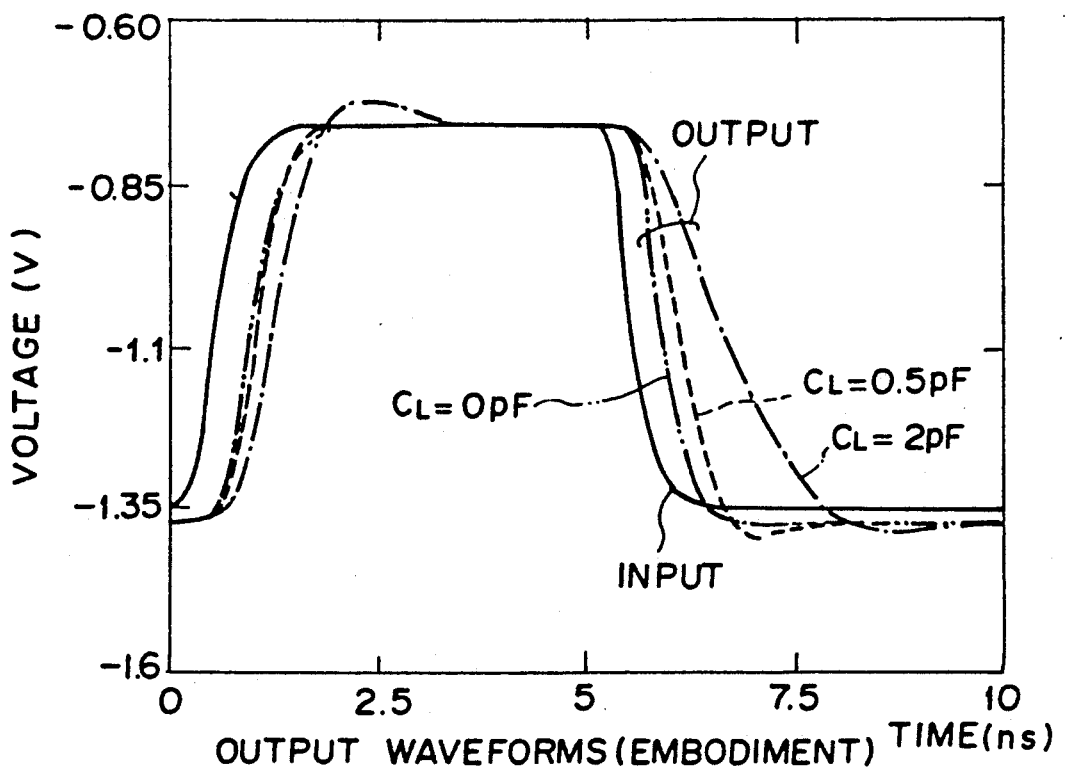
Figure 6:
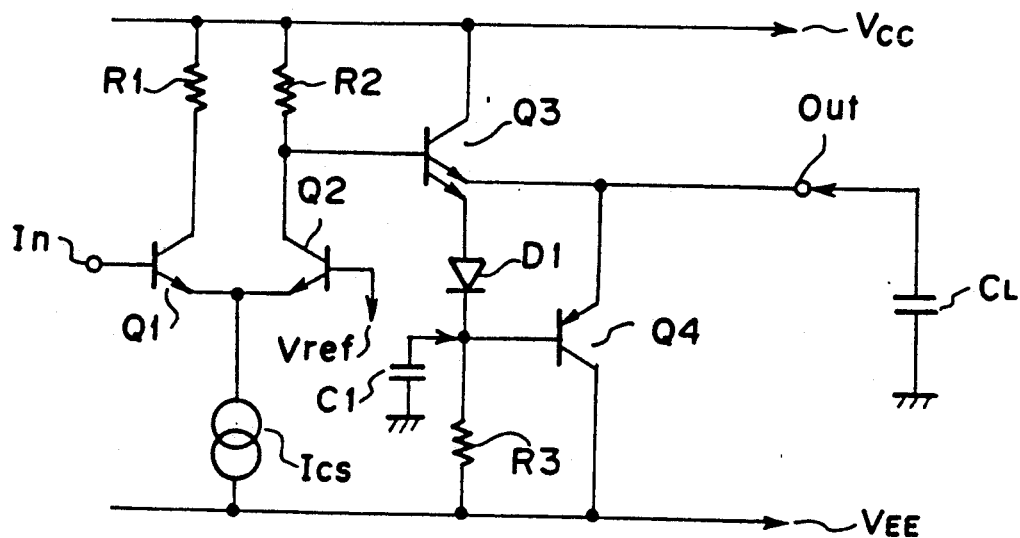
FIG. 6 shows a circuit diagram of a conventional emitter-follower circuit.

FIGS. 2 through 4 show, as results of simulation, characteristics of an ECL circuit having at its output portion an emitter-follower circuit according to the present embodiment of the invention, compared with those in the conventional circuit shown in FIG. 6. FIG. 2 is a graph showing how the delay time tpd during the signal level falling is changed due to $h_{FE}$ of the PNP transistor Q4. FIG. 3 is a graph showing the load capacitance dependence of the delay time tpd. FIGS. 4(a) and 4(b) show the load capacitance dependence of the output waveforms relating to the circuit according to the embodiment of the present invention and that according the conventional arrangement, respectively. The parameters used therein are as follows:

R1=R2=2 kΩ, R3=R4=8 kΩ
$I_{CS}$=0.3 mA
$V_{CC}$=0 V, $V_{EE}$= −5.2 V
$V_F$=0.75 V
$h_{FE}$ of PNP transistors=2
$h_{FE}$ of NPN transistors=90.

Figure 5:
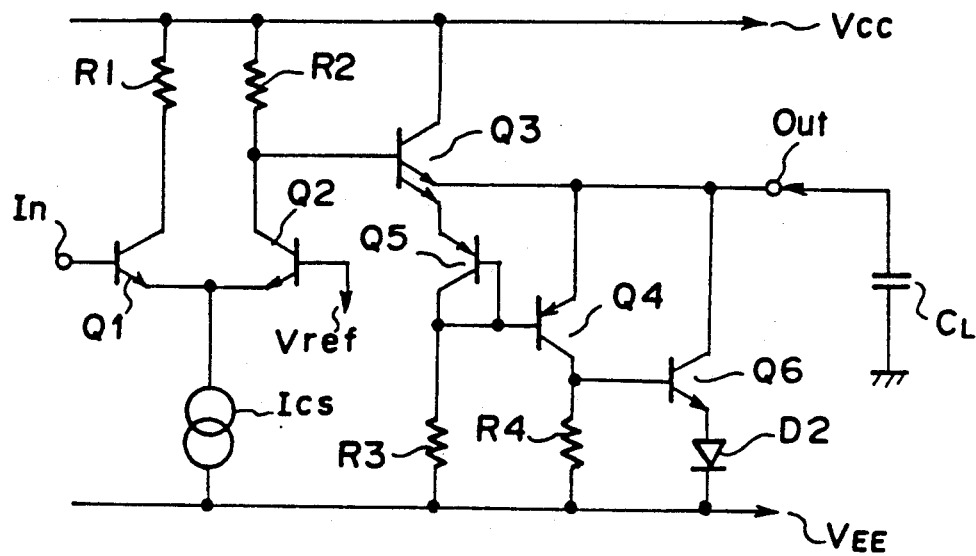
FIG. 5 is a circuit diagram of an ECL having as an output means an emitter-follower circuit according to a second embodiment of the present invention.

FIG. 5 is a circuit diagram of an ECL having as an output means an emitter-follower circuit according to a second embodiment of the present invention.

The emitter-follower circuit according to this embodiment comprises an emitter-follower transistor Q3 having multi-emitters, a biasing circuit including a diode-connected PNP transistor Q5 and a resistor R3, a load capacitance discharging state detection circuit including a PNP transistor Q4 operable based on a bias current from the biasing circuit, and a resistor R4 which is a second resistor, and a series circuit having a diode D2 which is a second diode, and an NPN transistor Q6 serving as a main discharging current path for discharging charge on the load capacitance.

In the circuit according to this embodiment, when the value of the resistor R4 is set to satisfy $$R4 \cdot I_H(R4) = \{h_{FE}/(2+h_{FE})\} \times (2V_F - V_{EE})R4/R3 < 2V_F,$$

it is possible to have the transistor Q6 maintain its off state during the Low state, the High state and the rising transition state.

As explained above, the features of the circuit according to the present invention reside in arrangements wherein, as distinguished from the prior art, the discharging current detecting resistor is connected between the collector of the PNP transistor and the power supply at the low potential side $V_{EE}$ so as to detect the current flowing in the PNP transistor for detecting a discharge current state and wherein the NPN transistor which operates based on the value thus detected and which forms the main discharging current path is connected between the output terminal and the power supply at the low potential side $V_{EE}$. Thus, according to the present invention, even when $h_{FE}$ of the discharging PNP transistor is low, the NPN transistor which has a high $h_{FE}$ forms the main discharging current path, so that the electric charge on the load due to the load capacitance can discharge rapidly by the low impedance circuit. Therefore, the present invention enables the switching speed to be high at the signal level falling of the emitter-follower circuit.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. In an emitter-follower circuit comprising:
   an input node, an output node, a higher potential power source ($V_{cc}$), and a lower potential power source ($V_{EE}$);
   a first resistor (R3);
   a first NPN transistor (Q3) having a first emitter and a second emitter, a base connected to said input node and a collector connected to said higher potential power source ($V_{cc}$);
   diode means (Q5) having an anode connected to said first emitter of said first NPN transistor and a cathode connected to said lower potential power source ($V_{EE}$) through said first resistor; and
   a PNP transistor (Q4) having an emitter connected to said output node commonly with said second emitter of said first NPN transistor, a base connected to the cathode of said diode means and a collector connected to said lower potential power source, the improvement comprising:
   a second resistor (R4) positioned between said collector of said PNP transistor and said lower potential power source ($V_{EE}$); and
   a second NPN transistor (Q6) having an emitter directly connected to said lower potential power source, a base connected to the collector of said PNP transistor and a collector connected to said output node.

2. An emitter-follower circuit according to claim 1, wherein said diode means is formed by a diode-connected PNP transistor (Q5) having an emitter connected to said first emitter of said first NPN transistor (Q3) and a base and a collector joined together and connected to one end of said first resistor (R3).

3. In an emitter-follower circuit comprising:
   an input node, an output node, a higher potential power source ($V_{cc}$), and a lower potential power source ($V_{EE}$);
   a first resistor (R3);
   a first NPN transistor (Q3) having a first emitter and a second emitter, a base connected to said input node and a collector connected to said higher potential power source ($V_{cc}$);
   diode means (Q5) having an anode connected to said first emitter of said first NPN transistor and a cathode connected to said lower potential power source ($V_{EE}$) through said first resistor; and
   a PNP transistor (Q4) having an emitter connected to said output node commonly with said second emitter of said first NPN transistor, a base connected to the cathode of said diode means and a collector connected to said lower potential power source, the improvement comprising:
   a second resistor (R4) positioned between said collector of said PNP transistor and said lower potential power source ($V_{EE}$);

a second NPN transistor (Q6) having an emitter connected to said lower potential power source, a base connected to the collector of said PNP transistor and a collector connected to said output node; and
a diode (D2) connected between the emitter of said second NPN transistor (Q6) and said lower potential power source ($V_{EE}$).

4. In an emitter-follower circuit comprising:
an input node, an output node, a higher potential power source ($V_{cc}$), and a lower potential power source ($V_{EE}$);
a first resistor (R3);
a first emitter-follower transistor (Q3) of a first conductivity type having a first emitter and a second emitter, a base connected to said input node and a collector connected to said higher potential power source;
a second diode-connected transistor (Q5) of a second conductivity type having an emitter connected to said first emitter of said first transistor and a base and a collector connected to said lower potential power source through said first resistor; and
a third transistor (Q4) of said second conductivity type having an emitter connected to said output node commonly with said second emitter of said first transistor, a base connected to the base and collector of said second transistor and having a collector connected to said lower potential power source, the improvement comprising:
a second resistor (R4) positioned between the collector of said third transistor and said lower potential power source; and
a fourth transistor (Q6) of said first conductivity type having an emitter directly connected to said lower potential power source, a base connected to the collector of said third transistor and a collector connected to said output node.

5. An emitter-follower circuit according to claim 4, wherein said first conductivity type is an NPN type and said second conductivity is a PNP type.

6. In an emitter-follower circuit comprising:
an input node, an output node, a higher potential power source ($V_{cc}$), and a lower potential power source ($V_{EE}$);
a first resistor (R3);
a first emitter follower transistor (Q3) of a first conductivity type having a first emitter and a second emitter, a base connected to said input node and a collector connected to said higher potential power source;
a second diode-connected transistor (Q5) of a second conductivity type having an emitter connected to said first emitter of said first transistor and a base and a collector connected to said lower potential power source through said first resistor; and
a third transistor (Q4) of said second conductivity type having an emitter connected to said output node commonly with said second emitter of said first transistor, a base connected to the base and collector of said second transistor and a collector connected to said lower potential power source, the improvement comprising:
a second resistor (R4) positioned between the collector of said third transistor and said lower potential power source;
a fourth transistor (Q6) of said first conductivity type having an emitter connected to said lower potential power source, a base connected to the collector of said third transistor and a collector connected to said output node; and
a diode connected between the emitter of said fourth transistor (Q6) and said lower potential power source ($V_{EE}$).

7. An emitter-follower circuit according to claim 6, wherein said first conductivity type is an NPN type and said second conductivity type is a PNP type.

* * * * *